(12) United States Patent
Wang et al.

(10) Patent No.: US 11,044,798 B2
(45) Date of Patent: Jun. 22, 2021

(54) ESD PROTECTION COMPOSITE STRUCTURE, ESD PROTECTION DEVICE, AND MANUFACTURING METHOD THEREOF

(71) Applicant: Industrial Technology Research Institute, Hsinchu (TW)

(72) Inventors: Ding-Shiang Wang, Tainan (TW); Jia-Jen Chang, Yunlin County (TW); Ming-Sheng Leu, Hsinchu County (TW); Tai-Sheng Chen, Kaohsiung (TW); Chin-Te Shih, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 289 days.

(21) Appl. No.: 16/152,425

(22) Filed: Oct. 5, 2018

(65) Prior Publication Data

US 2019/0364653 A1 Nov. 28, 2019

(30) Foreign Application Priority Data

May 25, 2018 (TW) .................................. 107118025

(51) Int. Cl.
*H05F 3/04* (2006.01)
*H01L 21/673* (2006.01)
(Continued)

(52) U.S. Cl.
CPC .............. *H05F 3/04* (2013.01); *B65G 47/74* (2013.01); *C23C 14/0021* (2013.01);
(Continued)

(58) Field of Classification Search
CPC ....... H05F 3/04; B65G 47/74; C23C 14/0021; C23C 14/024; C23C 14/083; C23C 14/14;
(Continued)

(56) References Cited

U.S. PATENT DOCUMENTS 5,955,762 A * 9/1999 Hively ................. H01L 21/563
257/355
6,503,627 B1 * 1/2003 Niimi .................. C03C 17/3405
428/409

(Continued)

FOREIGN PATENT DOCUMENTS

CN 1931851 3/2007
CN 103066186 4/2013
(Continued)

OTHER PUBLICATIONS

S.G. Springer et al., "Morphology and electrical properties of titaniumoxide nanometric multilayers deposited by DC reactive sputtering," Surface and Coatings Technology, vols. 151-152, Mar. 1, 2002, pp. 51-54.

(Continued)

*Primary Examiner* — Jue Zhang
(74) *Attorney, Agent, or Firm* — JCIPRNET

(57) ABSTRACT

An ESD protection composite structure includes a link layer, a progressive layer, and a composite layer. The link layer is used for disposing the ESD protection composite structure on a substrate, wherein a material of the link layer includes a metal material. The progressive layer is disposed on the link layer, wherein the material of the progressive layer includes a non-stoichiometric metal oxide material, and an oxygen concentration in the non-stoichiometric metal oxide material is increased gradually away from the substrate in a thickness direction of the progressive layer. The composite layer is disposed on the progressive layer, wherein the composite layer includes a stoichiometric metal oxide material and a non-stoichiometric metal oxide material, and a ratio of the non-stoichiometric metal oxide material and the stoichiometric metal oxide material in the composite layer (Continued)

may make a sheet resistance value of the composite layer $1\times10^7$ Ω/sq to $1\times10^8$ Ω/sq.

17 Claims, 4 Drawing Sheets

(51) Int. Cl.
| | |
|---|---|
| B65G 47/74 | (2006.01) |
| C23C 14/02 | (2006.01) |
| C23C 14/14 | (2006.01) |
| C23C 14/08 | (2006.01) |
| C23C 14/00 | (2006.01) |
| C23C 14/32 | (2006.01) |

(52) U.S. Cl.
CPC .......... C23C 14/024 (2013.01); C23C 14/083 (2013.01); C23C 14/14 (2013.01); C23C 14/325 (2013.01); H01L 21/67353 (2013.01); H01L 21/67366 (2013.01); H01L 21/67396 (2013.01)

(58) Field of Classification Search
CPC .............. C23C 14/325; H01L 21/67353; H01L 21/67366; H01L 21/67396
See application file for complete search history.

(56) References Cited

U.S. PATENT DOCUMENTS

| | | | |
|---|---|---|---|
| 6,641,939 B1 | 11/2003 | Lee et al. | |
| 7,014,912 B2 | 3/2006 | Suzuki et al. | |
| 7,041,365 B2* | 5/2006 | Kausch | B32B 7/02 |
| | | | 428/212 |
| 8,004,150 B2 | 8/2011 | Adachi et al. | |
| 8,559,155 B2 | 10/2013 | Gillard et al. | |
| 9,408,285 B2 | 8/2016 | Lee et al. | |
| 2004/0183135 A1 | 9/2004 | Kwon et al. | |
| 2010/0157496 A1* | 6/2010 | Asakura | H01T 4/08 |
| | | | 361/56 |
| 2015/0041728 A1 | 2/2015 | Shokri et al. | |

FOREIGN PATENT DOCUMENTS

| | | |
|---|---|---|
| KR | 20170035181 | 3/2017 |
| TW | 201614714 | 4/2016 |

OTHER PUBLICATIONS

Michał Mazur et al., "Electrical and antistatic properties of magnetron sputtered thin films based on TiO2:(V, Ta)", 2011 International Students and Young Scientists Workshop „Photonics and Microsystems, 2011, pp. 89-93.

* cited by examiner

ESD PROTECTION COMPOSITE STRUCTURE, ESD PROTECTION DEVICE, AND MANUFACTURING METHOD THEREOF

CROSS-REFERENCE TO RELATED APPLICATION

This application claims the priority benefit of Taiwan application serial no. 107118025, filed on May 25, 2018. The entirety of the above-mentioned patent application is hereby incorporated by reference herein and made a part of this specification.

TECHNICAL FIELD

The disclosure relates to an ESD protection device and a manufacturing method thereof, and more particularly, to an ESD protection composite structure, an ESD protection device formed by the ESD protection composite structure, and a manufacturing method thereof.

BACKGROUND

In the current semiconductor industry, many related specifications and related materials of ESD protection have been developed. For instance, a conventional process and shipping process both have corresponding steps and materials, and even the humidity environment inside the factory is strictly regulated. However, in recent years, as electronic components have become smaller and more centralized, the circuit of the conductor equipment is more sophisticated, and spacing between wires is smaller, and therefore antistatic properties need to be improved.

In particular, in a high-temperature process, a carrier tray carrying a semiconductor device needs to tolerate a high-temperature environment (temperature resistance in prolonged use >300° C.). To meet the demand of tolerating a high-temperature environment above, the carrier tray in a high-temperature process is still based on a metal material, but since the equivalent resistance of the metal material is low, once electrostatic discharge damage occurs, the discharge current thereof is large and the discharge duration is very short, such that significant damage to the device occurs. Therefore, an ESD protection material needs to be formed on the metal carrier tray to avoid the issue of damage to the semiconductor device on the carrier tray by the generation of electrostatic discharge.

The ESD protection material used here also needs to meet the demand for high-temperature resistance, but the ESD protection material meeting the demand of high-temperature resistance has issues such as the material itself is expensive, the process is complex such that production costs are high, and the mechanical properties of the resulting ESD protection material are still insufficient.

SUMMARY

The disclosure provides an ESD protection composite structure. The ESD protection composite structure includes a link layer, a progressive layer, and a composite layer. The link layer is used for disposing the ESD protection composite structure on a substrate, wherein a material of the link layer includes a metal material. The progressive layer is disposed on the link layer, wherein a material of the progressive layer includes a non-stoichiometric metal oxide material, and an oxygen concentration in the non-stoichiometric metal oxide material is increased gradually away from the substrate in a thickness direction of the progressive layer. The composite layer is disposed on the progressive layer, wherein the composite layer includes a stoichiometric metal oxide material and a non-stoichiometric metal oxide material, and a ratio of the non-stoichiometric metal oxide material and the stoichiometric metal oxide material in the composite layer may make a sheet resistance value of the composite layer $1\times10^7$ Ω/sq to $1\times10^8$ Ω/sq.

Moreover, the disclosure provides an ESD protection device. The ESD protection device includes a substrate and the ESD protection composite structure mentioned above, and the ESD protection composite structure is disposed on a substrate via a link layer.

Moreover, the disclosure provides a manufacturing method of an ESD protection device. The manufacturing method of the ESD protection device includes the following steps. A surface treatment is performed on the substrate. A link layer is formed on the substrate after the surface treatment, wherein a material of the link layer includes a metal material. A progressive layer is formed on the link layer, wherein a material of the progressive layer includes a non-stoichiometric metal oxide material, and an oxygen concentration in the non-stoichiometric metal oxide material is increased gradually away from the substrate in a thickness direction of the progressive layer. A composite layer is formed on the progressive layer, wherein the composite layer includes a stoichiometric metal oxide material and a non-stoichiometric metal oxide material, and a ratio of the non-stoichiometric metal oxide material and the stoichiometric metal oxide material in the composite layer may make a sheet resistance value of the composite layer $1\times10^7$ Ω/sq to $1\times10^8$ Ω/sq.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

FIG. 1A to FIG. 1D are schematics of the manufacturing process of an ESD protection device 10 of an embodiment of the disclosure.

Figure 1A:
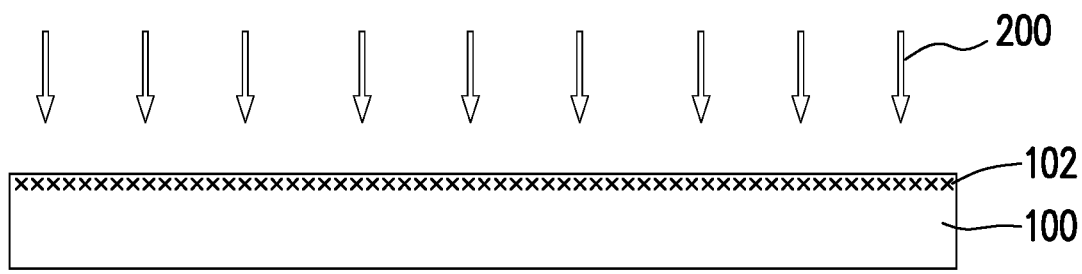
FIG. 1A to FIG. 1D are schematics of the manufacturing process of a ESD protection device of an embodiment of the disclosure.

Referring to FIG. 1A, a substrate 100 is provided, and a surface treatment 200 is performed on the substrate 100 to form a surface treatment layer 102 on a surface of the substrate 100. The substrate 100 is, for instance, a carrier tray for carrying a semiconductor device in a semiconductor process. The material of the substrate 100 is, for instance, a metal material, ceramic material, resin material, or a composite material of these materials. The metal material may be, for instance, stainless steel or aluminum, the ceramic material may be, for instance, $TiO_2$, $Al_2O_3$, CuO, NiO, $Cr_2O_3$, $Ta_2O_5$, or $V_2O_5$, and the resin material may be, for instance, polycarbonate, epoxy resin, polyvinyl chloride, polypropylene, or polyethylene terephthalate.

In some exemplary embodiments, the surface treatment 200 includes, for instance, disposing the substrate 100 in an arc ion plating apparatus, and performing surface treatment on the substrate 100 using oxygen/argon as a plasma to form the surface treatment layer 102 on the surface of the substrate 100. In some embodiments, the material of the substrate 100 is, for instance, aluminum or stainless steel, the ratio of oxygen/argon is, for instance, 0.5:1 to 1:0.5, the process bias is, for instance, 500 V to 900 V, and in some exemplary embodiments, the ratio of oxygen/argon is, for instance, 0.65:1 to 0.85:1, and the process bias is, for instance, 600 V to 800 V.

Figure 1B:
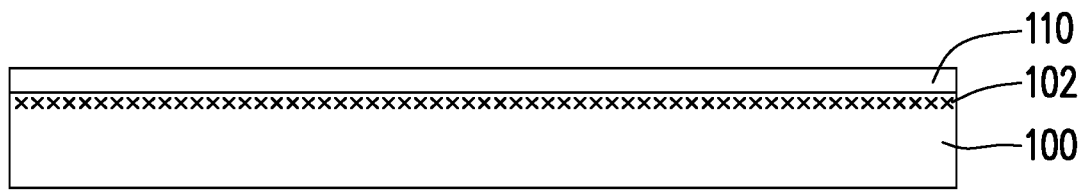

Next, referring to FIG. 1B, a link layer 110 is formed on the surface treatment layer 102 of the substrate 100, wherein the material of the link layer 110 includes a metal material. The metal material may be, for instance, a metal suitable for forming metal oxide (i.e., the so-called ceramic material) such as Ti, Al, Cu, Ni, Cr, Ta, or V.

In some exemplary embodiments, the forming of the link layer 110 includes, for instance, using the arc ion plating apparatus of the exemplary embodiment of FIG. 1A and the substrate 100 after the surface treatment and providing a metal target as the metal source to deposit a metal ion produced by the metal source on the surface treatment layer 102 of the substrate 100 to form the link layer 110 on the surface treatment layer 102 of the substrate 100. In some embodiments, the metal material in the link layer 100 may be, for instance, a Ti target, Al target, Cu target, Ni target, Cr target, Ta target, or V target. In some embodiments, the metal target is, for instance, a Ti target, the process current density is, for instance, $0.494 \ A/cm^2$ to $0.988 \ A/cm^2$, the process bias is, for instance, 100 V to 400 V, the thickness of the resulting link layer 110 is, for instance, 5 nm to 200 nm, and the link layer 110 is mainly formed by Ti.

Figure 1C:
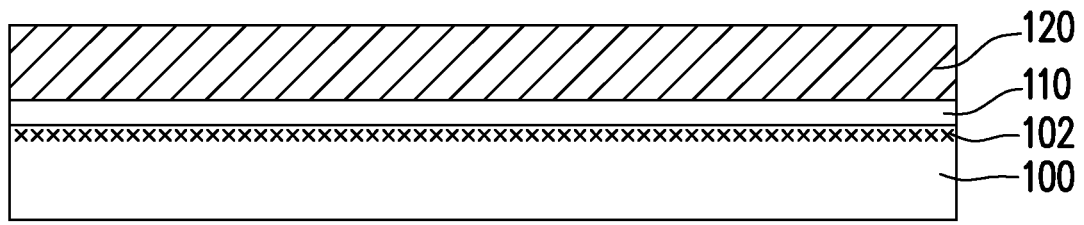

Next, referring to FIG. 1C, a progressive layer 120 is formed on the link layer 110, wherein the material of the progressive layer 120 includes a non-stoichiometric metal oxide material, and an oxygen concentration in the non-stoichiometric metal oxide material is increased gradually away from the substrate 100 in a thickness direction of the progressive layer 120. The non-stoichiometric metal oxide material may be, for instance, TiOx, AlOx, CuOx, NiOx, CrOx, TaOx, or VOx, wherein 0<x<stoichiometry of metal oxide (in the case of TiOx, x is less than 2), and the value of x is gradually increased away from the substrate 100 in the thickness direction of the progressive layer 120.

In some exemplary embodiments, the forming of the progressive layer 120 includes, for instance, using the arc ion plating apparatus of the exemplary embodiment of FIG. 1B, the substrate 100 having the link layer 110 and the metal target, and providing oxygen as a reaction gas at the same time the metal ion is provided by the metal target to deposit the resulting non-stoichiometric metal oxide material on the link layer 110 so as to form the progressive layer 120 on the link layer 110, wherein the supply of oxygen is gradually increased with process time. In some embodiments, the metal target is, for instance, the same Ti target and has a process current density of, for instance, $0.494 \ A/cm^2$ to $0.988 \ A/cm^2$, a process bias of, for instance, 50 V to 300 V, and a supply of oxygen of, for instance, 60 sccm to 100 sccm, and the increasing trend is 5% to 10% every 10 minutes, the thickness of the resulting progressive layer 120 is, for instance, 50 nm to 500 nm, and the progressive layer 120 is mainly formed by TiOx (wherein 0<x<1.5).

Figure 1D:
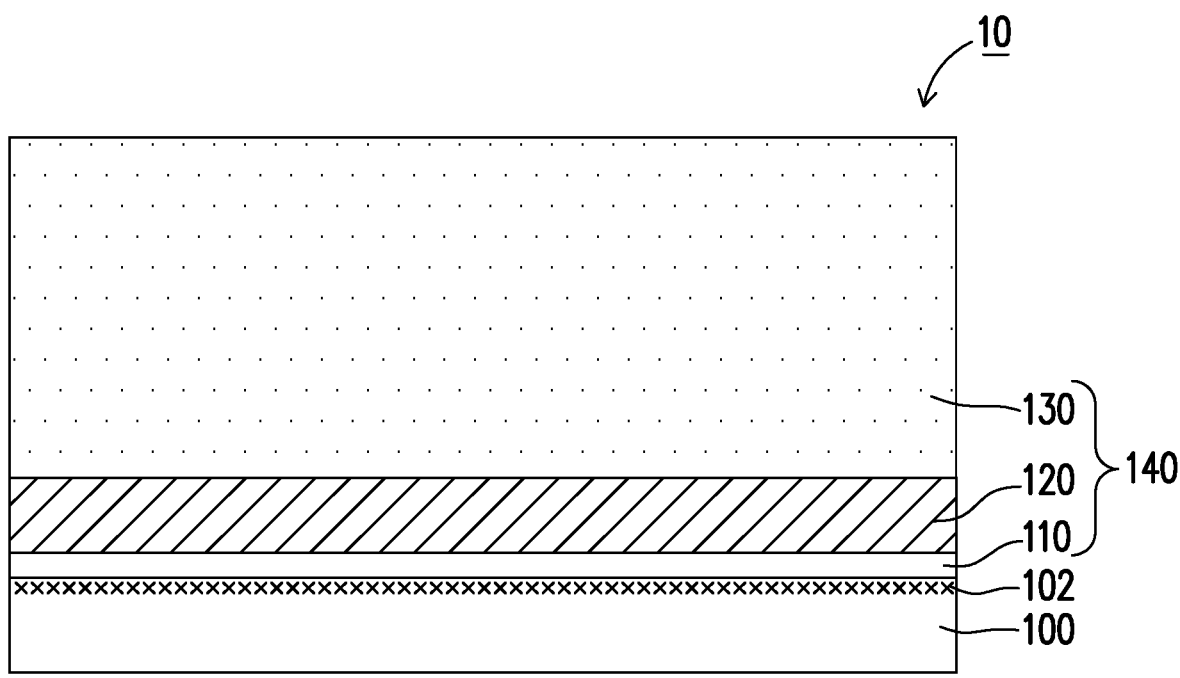

Next, referring to FIG. 1D, a composite layer 130 is formed on the progressive layer 120, wherein the material of the composite layer 130 includes a stoichiometric metal oxide material and a non-stoichiometric metal oxide material, and a ratio of the non-stoichiometric metal oxide material and the stoichiometric metal oxide material in the composite layer 130 may make a sheet resistance value of the composite layer 130 $1\times10^7$ Ω/sq to $1\times10^8$ Ω/sq. The stoichiometric metal oxide material may be, for instance, $TiO_2$, $Al_2O_3$, CuO, NiO, $Cr_2O_3$, $Ta_2O_5$, or $V_2O_5$. The non-stoichiometric metal oxide material may be, for instance, TiOx, AlOx, CuOx, NiOx, CrOx, TaOx, or VOx, wherein 0<x<stoichiometry of metal oxide. Moreover, the ratio of the non-stoichiometric metal oxide material and the stoichiometric metal oxide material that may make the sheet resistance value of the composite layer 130 $1\times10^7$ Ω/sq to $1\times10^8$ Ω/sq is, for instance, 0.005:1 to 0.01:1.

The reason that the material of the composite layer 130 includes a stoichiometric metal oxide material and a non-stoichiometric metal oxide material is that the sheet resistance value of the stoichiometric metal oxide material is too high (about $1\times10^{12}$ Ω/sq in the case of $TiO_2$) such that the issue of being unsuitable for ESD protection application exists, and therefore in the disclosure, by mixing a non-stoichiometric metal oxide material of a specific ratio in the stoichiometric metal oxide material, the sheet resistance value of the composite layer 130 may be $1\times10^7$ f/sq to $1\times10^8$ Ω/sq suitable for ESD protection application.

In some exemplary embodiments, the forming of the composite layer 130 includes, for instance, using the arc ion plating apparatus of the exemplary embodiment of FIG. 1C, the substrate 100 having the link layer 110 and the progressive layer 120, and the metal target, and providing oxygen as a reaction gas at the same time the metal ion is provided by the metal target to deposit the resulting stoichiometric metal oxide material and non-stoichiometric metal oxide material on the progressive layer 120 so as to form the composite layer 130 on the progressive layer 120, wherein the supply of oxygen is configured such that the ratio of the non-stoichiometric metal oxide material and the stoichiometric metal oxide material in the resulting composite layer 130 may make the sheet resistance value of the composite layer 130 $1\times10^7$ Ω/sq to $1\times10^8$ Ω/sq. In some embodiments, the metal target is, for instance, the same Ti target and has a process current density of, for instance, $0.494 \ A/cm^2$ to $0.988 \ A/cm^2$, a process bias of, for instance, 50 V to 300 V, and a supply of oxygen of, for instance, 80 sccm to 150 sccm, the increasing trend is 8% to 15% every 10 minutes, the thickness of the resulting composite layer 130 is, for instance, 50 nm to 3000 nm, and the composite layer 130 is mainly formed by $TiO_2$ and TiOx, the ratio of TiOx and $TiO_2$ in the composite layer 130 is, for instance, 0.005:1 to 0.01:1, and the sheet resistance value of the composite layer 130 is, for instance, $1\times10^7$ Ω/sq to $1\times10^8$ Ω/sq.

Via the manufacturing method recited in FIG. 1A to FIG. 1D above, the ESD protection device 10 having the ESD protection composite structure 140 of the disclosure may be manufactured. Moreover, in the exemplary embodiments above, an arc ion plating apparatus is used as the deposition equipment forming the ESD protection device 10 of the disclosure, but the disclosure is not limited thereto, and in the case that the ESD protection device 10 having the ESD protection composite structure 140 of the disclosure may be formed using the same deposition equipment and the same metal source, other physical vapor deposition equipment or chemical vapor deposition equipment may also be used in the disclosure.

The ESD protection device 10 having the ESD protection composite structure 140 of the disclosure is described via FIG. 1D.

The ESD protection device 10 of the disclosure includes an ESD protection composite structure 140 and a substrate 100. The ESD protection composite structure 140 includes a link layer 110, a progressive layer 120, and a composite layer 130. The link layer 110 is disposed on the surface treatment layer 102 of the substrate 100, wherein the material of the link layer 110 includes a metal material. The progressive layer 120 is disposed on the link layer 110, wherein the material of the progressive layer 120 includes a non-stoichiometric metal oxide material, and an oxygen concentration in the non-stoichiometric metal oxide material is increased gradually away from the substrate 100 in a thickness direction of the progressive layer 120. The composite layer 130 is disposed on the progressive layer 120, wherein the material of the composite layer 130 includes a stoichiometric metal oxide material and a non-stoichiometric metal oxide material, and a ratio of the non-stoichiometric metal oxide material and the stoichiometric metal oxide material may make a sheet resistance value of the composite layer 130 $1\times10^7$ Ω/sq to $1\times10^8$ Ω/sq. In an embodiment, metals in the metal material, the stoichiometric metal oxide material, and the non-stoichiometric metal oxide material in the ESD protection composite structure 140 are the same. Moreover, in an embodiment, the ESD protection composite structure 140 has a hardness of, for instance, 8 GPa to 12 GPa, a pencil hardness of, 5 to 7, an adhesion of, for instance, 8 N to 12N, a temperature resistance of, for instance, room temperature to 500° C., and a thickness of, for instance, 105 nm to 3000 nm.

In addition to the hardness, pencil hardness, adhesion, temperature resistance, and the thickness of the ESD protection composite structure 140, the material and specification of each member in the ESD protection device 10 are described in detail in the manufacturing method of FIG. 1A to FIG. 1D above and are therefore not repeated herein.

It may be known from the manufacturing method and the resulting ESD protection device that, by performing the surface treatment 200 on the substrate 100 and then forming the link layer 110 on the substrate 100 after the surface treatment, the adhesion of the link layer 110 and the substrate 100 (surface treatment layer 102) may be increased. Moreover, by forming the progressive layer 120 between the composite layer 130 and the link layer 110, the composite layer 130 having a stoichiometric metal oxide as the main component may be adhered well to the link layer 110 having a metal as the main component via the progressive layer 120. As a result, the ESD protection composite structure 140 of the disclosure has good adhesion with the substrate 100 as a whole. In the case that the adhesion between the ESD protection composite structure 140 and the substrate 100 is good, since the ESD protection composite structure 140 is not readily peeled off, the ESD protection device 100 of the disclosure may also have high hardness and high pencil hardness.

Moreover, based on the material (metal material, non-stoichiometric metal oxide material, and a mixture of stoichiometric metal oxide material and non-stoichiometric metal oxide material) of each layer of the ESD protection composite structure of the disclosure, the ESD protection composite structure of the disclosure as a whole may have high-temperature resistance properties. Moreover, since the material of the composite layer 130 of the topmost layer may obtain a sheet resistance value of $1\times10^7$ Ω/sq to $1\times10^8$ Ω/sq suitable for ESD protection application by mixing a non-stoichiometric metal oxide material of a specific ratio in the stoichiometric metal oxide material, good ESD protection properties may be obtained, and good acid and alkali corrosion resistance properties may be obtained based on the properties of the stoichiometric metal oxide material.

Moreover, it may be known from the manufacturing method above that, all of the films of FIG. 1A to FIG. 1D of the disclosure may be completed using the same deposition equipment (arc ion plating apparatus) and using the same metal source (metal target). In particular, the progressive layer 120 and the composite layer 130 having the properties of the disclosure may be formed by adjusting the flow of the reaction gas (oxygen plasma), and therefore the manufacturing method of the disclosure may be simplified. Moreover, since in the disclosure, a metal target is used as the common metal source of each layer in the ESD protection composite structure, the metal target is relatively cheap and having a large process area to facilitate industrialization. Based on the above, in the disclosure, an ESD protection device having an ESD protection composite structure having good ESD protection properties, high-temperature resistance, high mechanical properties, and high acid and alkali corrosion resistance properties may be manufactured via a cheap and simple manufacturing method.

Experimental Examples

<Manufacture of ESD Protection Device>

An arc ion plating apparatus was used to form a test piece of an ESD protection device having the ESD protection composite structure of the disclosure on a test substrate (experimental examples 1 to 4). The observation results of the resulting test pieces of experimental examples 1 to 4 show that the resulting films are complete and do not show signs of peeling. Moreover, the sheet resistance values obtained in a sheet resistance value test performed on the test pieces of experimental examples 1 to 4 are all in the range of $1\times10^7$ Ω/sq to $1\times10^8$ Ω/sq. The test results of experimental examples 1 to 4 are provided in Table 1.

TABLE 1

|  |  | Experimental example 1 | Experimental example 2 | Experimental example 3 | Experimental example 4 |
| --- | --- | --- | --- | --- | --- |
| Substrate |  | Al | Al | Al | Al |
| Target |  | Ti | Ti | Ti | Ti |
| Surface treatment | Plasma | Oxygen/argon | Oxygen/argon | Oxygen/argon | Oxygen/argon |
|  | Process bias (V) | 650 | 700 | 750 | 850 |
| Link layer | Process | 0.850 | 0.750 | 0.750 | 0.850 |

TABLE 1-continued

| | | Experimental example 1 | Experimental example 2 | Experimental example 3 | Experimental example 4 |
|---|---|---|---|---|---|
| | current density (A/cm$^2$) | | | | |
| | Process bias (V) | 300 | 300 | 300 | 300 |
| Progressive layer | Process current density (A/cm$^2$) | 0.850 | 0.750 | 0.750 | 0.850 |
| | Process bias (V) | 250 | 250 | 250 | 250 |
| | Oxygen flow | 60 | 60 | 80 | 80 |
| Composite layer | Process current density (A/cm$^2$) | 0.750 | 0.650 | 0.650 | 0.650 |
| | Process bias (V) | 100 | 100 | 100 | 100 |
| | Oxygen flow | 90 | 90 | 120 | 150 |
| Thickness (nm) of ESD protection composite structure | | 1800 | 1800 | 1800 | 1800 |
| Film integrity | | No peeling | No peeling | No peeling | No peeling |
| Sheet resistance value (Ω/sq) | | $1 \times 10^7$ to $1 \times 10^8$ | $1 \times 10^7$ to $1 \times 10^8$ | $1 \times 10^7$ to $1 \times 10^8$ | $1 \times 10^7$ to $1 \times 10^8$ |
| Film integrity after temperature resistance test | | No peeling | No peeling | No peeling | No peeling |
| Sheet resistance value (Ω/sq) after temperature resistance test | | $1 \times 10^7$ to $1 \times 10^8$ | $1 \times 10^7$ to $1 \times 10^8$ | $1 \times 10^7$ to $1 \times 10^8$ | $1 \times 10^7$ to $1 \times 10^8$ |
| Pencil hardness | | ≥6H | ≥6H | ≥6H | ≥6H |

<Temperature Resistance Test and Electrical Property Test of ESD Protection Device>

Figure 2:
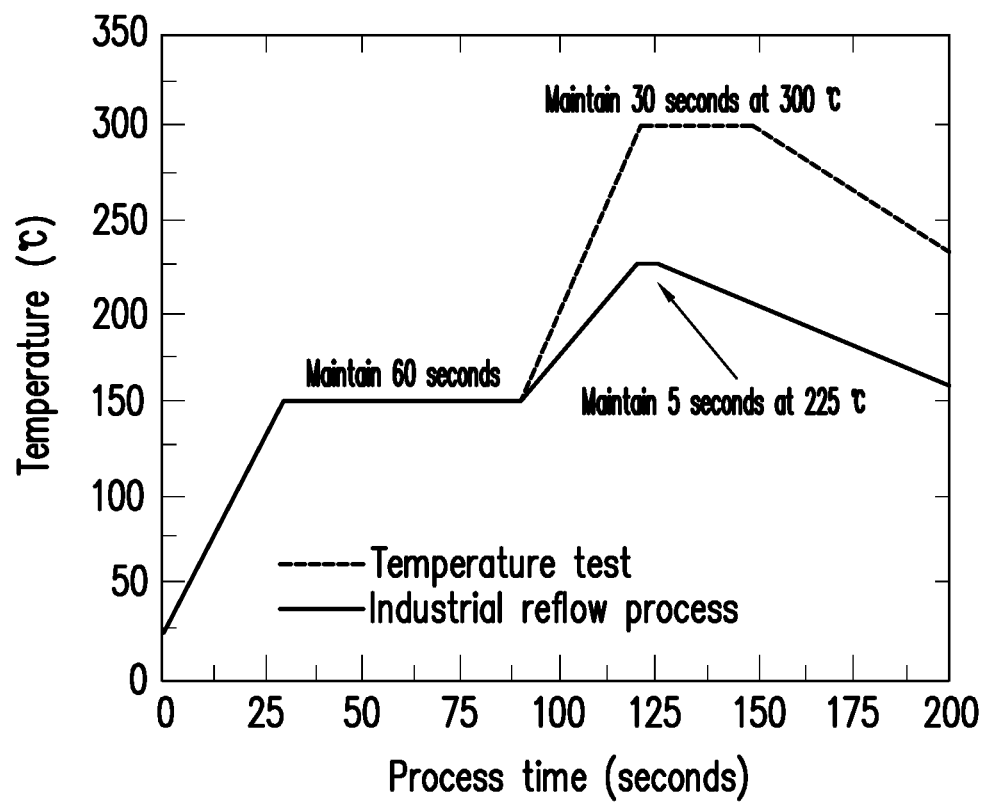
FIG. 2 shows a heating curve of a rapid thermal annealing (RTA) temperature test of the disclosure and a heating curve of an industrial reflow process.

FIG. 2 shows a heating curve of an RTA temperature test of the disclosure and a heating curve of an industrial reflow process. In FIG. 2, the heating curve of the industrial reflow process represented by a solid line is the standard for a high-temperature process generally used in current industries, and in the disclosure, a temperature resistance test was performed using a stricter (high temperature) standard than the industrial reflow process represented by the dotted line. Next, 50 RTA temperature tests were performed on the test pieces of experimental examples 1 to 4 using the heating curve shown by the dotted line of FIG. 2. After the tests, the surface of each test piece was inspected to confirm the surface of each test piece remained intact and the film did not peel off due to the high-temperature process. Next, a sheet resistance value test was performed on the test pieces after the RTA temperature tests, and the measured sheet resistances were all in the range of 1×10$^7$ Ω/sq to 1×10$^8$ Ω/sq. It may be known from the above tests that, the ESD protection device of the disclosure has good temperature resistance properties higher than current industrial standards and good adhesion for a substrate, and has good ESD protection properties. Moreover, the test results of experimental examples 1 to 4 are provided in Table 1.

<Acid and Alkali Corrosion Resistance Test of ESD Protection Device>

Figure 3:
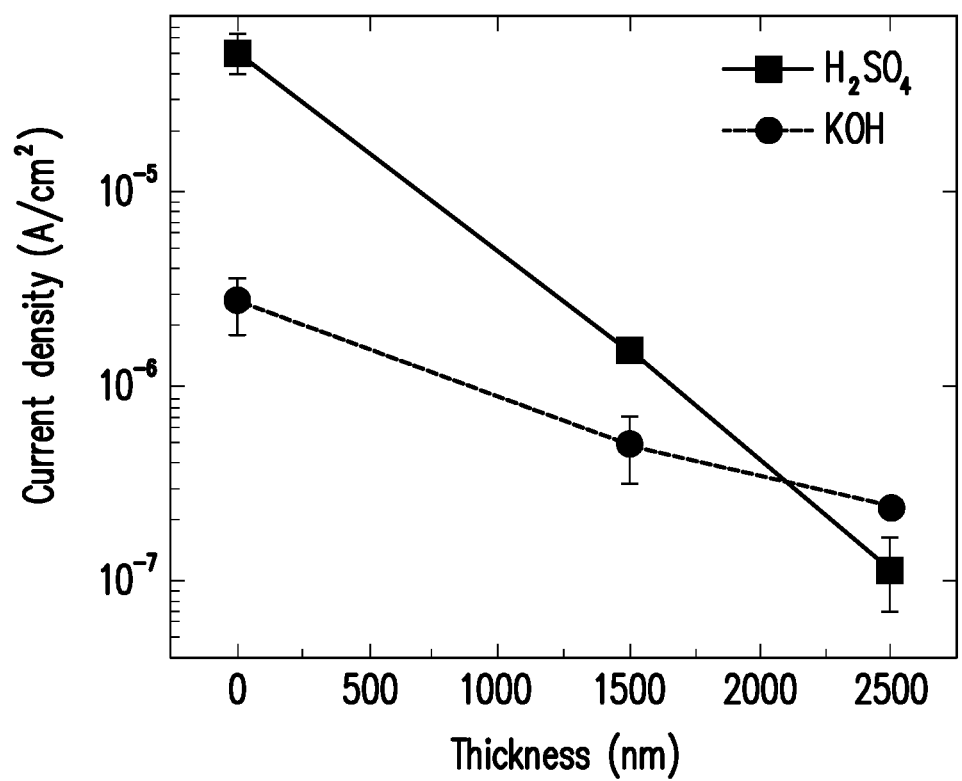
FIG. 3 is a figure of current density versus film thickness of a corrosion resistance test of the disclosure.

A 15 cm×15 cm 304 stainless steel was used as a substrate, and test pieces with thickness of 1500 nm and 2500 nm of an ESD protection composite structure were respectively manufactured. Next, a blank sheet (304 stainless steel substrate without an ESD protection composite structure), the 1500 nm test piece, and the 2500 nm test piece were respectively brought in contact with sulfuric acid ($H_2SO_4$) and potassium hydroxide (KOH), and then the current density of the blank piece and each test piece was measured. The measured results are shown in FIG. 3. It may be known from FIG. 3 that, the current density measured using the blank sheet (thickness: 0 nm) after the sulfuric acid treatment was 5.11×10$^{-5}$ A/cm$^2$, and the current density was reduced to 1.15×10$^{-7}$ A/cm$^2$ as the film thickness of the ESD protection composite structure of the test piece was increased. The current density measured using the blank sheet (thickness: 0 nm) after the sodium hydroxide treatment was 2.07×10$^{-6}$ A/cm$^2$, and the current density was reduced to 2.24×10$^{-7}$ A/cm$^2$ as the film thickness of the ESD protection composite structure of the test piece was increased. The reduction of current density here refers to good acid and alkali corrosion resistance, and therefore the ESD protection device of the disclosure has good acid and alkali corrosion resistance.

<Pencil Hardness Test of ESD Protection Device>

A pencil hardness test was performed on the test pieces of experimental examples 1 to 4 using a pencil hardness tester. The test results show that, the pencil hardnesses of the test pieces of experimental examples 1 to 4 are all 6H or above, and therefore the ESD protection device of the disclosure has good hardness properties. Moreover, the test results of experimental examples 1 to 4 are provided in Table 1.

Based on the above, the ESD protection composite structure of the disclosure has a composite structure formed by a link layer (metal material)/progressive layer (non-stoichiometric metal oxide material having an oxygen concentration varying with film thickness)/composite layer (for which a stoichiometric metal oxide material used as the main component is mixed with a non-stoichiometric metal oxide material and having a sheet resistance value suitable for ESD protection application). In particular, the ESD protection composite structure has good adhesion with the substrate as a whole via the link layer and the progressive layer, ESD protection properties and acid and alkali corrosion resistance properties are provided via the composite layer, high-temperature resistance properties are provided via each layer material of the ESD protection composite structure, and the ESD protection composite structure further has high hardness and high pencil hardness via good adhesion. Therefore, the ESD protection device having the ESD protection composite structure of the disclosure may have all of good ESD protection properties, high-temperature resistance, high mechanical properties (adhesion, hardness, and pencil hardness), and high acid and alkali corrosion resistance properties.

Moreover, the ESD protection device of the disclosure may be completed using the same deposition equipment (arc ion plating apparatus) and using the same metal source (metal target). In particular, the progressive layer and composite layer having the properties of the disclosure may be formed by adjusting the flow of the reaction gas, and therefore the manufacturing method of the disclosure may be simplified. Moreover, since in the disclosure, a metal target is used as the common metal source of each layer in the ESD protection composite structure, the metal target is relatively cheap and having a large process area to facilitate industrialization. Therefore, in the disclosure, an ESD protection composite structure and an ESD protection device with all the good properties of the disclosure may be manufactured via a cheap and simple manufacturing method.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An ESD protection composite structure, comprising:
   a link layer used for disposing the ESD protection composite structure on a substrate, wherein a material of the link layer comprises a metal material;
   a progressive layer disposed on the link layer, wherein a material of the progressive layer comprises a non-stoichiometric metal oxide material, and an oxygen concentration in the non-stoichiometric metal oxide material is increased gradually away from the substrate in a thickness direction of the progressive layer; and
   a composite layer disposed on the progressive layer, wherein the composite layer comprises a stoichiometric metal oxide material and a non-stoichiometric metal oxide material, and a ratio of the non-stoichiometric metal oxide material and the stoichiometric metal oxide material in the composite layer may make a sheet resistance value of the composite layer $1 \times 10^7$ Ω/sq to $1 \times 10^8$ Ω/sq.

2. The ESD protection composite structure of claim 1, wherein metals in the metal material, the stoichiometric metal oxide material, and the non-stoichiometric metal oxide material are the same.

3. The ESD protection composite structure of claim 1, wherein a ratio of the non-stoichiometric metal oxide material and the stoichiometric metal oxide material in the composite layer is 0.005:1 to 0.01:1.

4. The ESD protection composite structure of claim 1, wherein the metal material comprises Ti, Al, Cu, Ni, Cr, Ta, or V, the non-stoichiometric metal oxide material comprises TiOx, AlOx, CuOx, NiOx, CrOx, TaOx, or VOx, and 0<x<a stoichiometry of a metal oxide, and the stoichiometric metal oxide material comprises $TiO_2$, $Al_2O_3$, CuO, NiO, $Cr_2O_3$, $Ta_2O_5$, or $V_2O_5$.

5. The ESD protection composite structure of claim 1, wherein the metal material is Ti, the non-stoichiometric metal oxide material is TiOx, the stoichiometric metal oxide material is $TiO_2$, and x in TiOx in the progressive layer is 0<x<1.5 and x in TiOx in the composite layer is 1.5<x<2.

6. The ESD protection composite structure of claim 1, wherein a thickness of the ESD protection composite structure is 105 nm to 3000 nm.

7. The ESD protection composite structure of claim 1, wherein the ESD protection composite structure has a hardness of 8 GPa to 12 GPa, a pencil hardness of 5 to 7, an adhesion of 8 N to 12 N, and a temperature resistance of a room temperature to 500° C.

8. An ESD protection device, comprising:
   a substrate; and
   the ESD protection composite structure of claim 1 disposed on the substrate via a link layer.

9. The ESD protection device of claim 8, wherein a material of the substrate comprises a metal material, a ceramic material, a resin material, or a combination of the materials.

10. The ESD protection device of claim 9, wherein the metal material comprises stainless steel or aluminum, the ceramic material comprises $TiO_2$, $Al_2O_3$, CuO, NiO, $Cr_2O_3$, $Ta_2O_5$, or $V_2O_5$, and the resin material comprises polycarbonate, epoxy resin, polyvinyl chloride, polypropylene, or polyethylene terephthalate.

11. The ESD protection device of claim 8, wherein a surface of the substrate has a surface treatment layer, and the link layer is formed on the surface treatment layer.

12. The ESD protection device of claim 8, wherein metals in the metal material, the stoichiometric metal oxide material, and the non-stoichiometric metal oxide material are the same.

13. The ESD protection device of claim 8, wherein a ratio of the non-stoichiometric metal oxide material and the stoichiometric metal oxide material in the composite layer is 0.005:1 to 0.01:1.

14. The ESD protection device of claim 8, wherein the metal material comprises Ti, Al, Cu, Ni, Cr, Ta, or V, the non-stoichiometric metal oxide material comprises TiOx, AlOx, CuOx, NiOx, CrOx, TaOx, or VOx, and 0<x<a stoichiometry of a metal oxide, and the stoichiometric metal oxide material comprises $TiO_2$, $Al_2O_3$, CuO, NiO, $Cr_2O_3$, $Ta_2O_5$, or $V_2O_5$.

15. The ESD protection device of claim 8, wherein a material of the substrate is aluminum or stainless steel, the metal material is Ti, the non-stoichiometric metal oxide material is TiOx, the stoichiometric metal oxide material is $TiO_2$, and x in TiOx in the progressive layer is 0<x<1.5 and x in TiOx in the composite layer is 1.5<x<2.

16. The ESD protection device of claim 8, wherein a thickness of the ESD protection composite structure is 105 nm to 3000 nm.

17. The ESD protection device of claim 8, wherein the ESD protection composite structure has a hardness of 8 GPa to 12 GPa, a pencil hardness of 5 to 7, an adhesion of 8 N to 12 N, and a temperature resistance of a room temperature to 500° C.

* * * * *